(12) United States Patent
Park et al.

(10) Patent No.: US 10,839,756 B2
(45) Date of Patent: Nov. 17, 2020

(54) MICRO DISPLAY DEVICE AND DISPLAY INTEGRATED CIRCUIT HAVING DUAL CHIPS STACKED WITH EACH OTHER

(71) Applicant: LG Display Co., Ltd., Seoul (KR)

(72) Inventors: Hyunkyu Park, Goyang-si (KR); Jaehun Jun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 49 days.

(21) Appl. No.: 16/210,707

(22) Filed: Dec. 5, 2018

(65) Prior Publication Data

US 2019/0180696 A1 Jun. 13, 2019

(30) Foreign Application Priority Data

Dec. 12, 2017 (KR) ........................ 10-2017-0169993

(51) Int. Cl.
| | |
|---|---|
| G09G 3/20 | (2006.01) |
| G09G 3/3291 | (2016.01) |
| G09G 3/3266 | (2016.01) |
| G09G 3/3258 | (2016.01) |
| H01L 27/32 | (2006.01) |
| H01L 51/52 | (2006.01) |
| G02B 27/01 | (2006.01) |

(Continued)

(52) U.S. Cl.
CPC ....... *G09G 3/3291* (2013.01); *G02B 27/0172* (2013.01); *G09G 3/3233* (2013.01); *G09G 3/3258* (2013.01); *G09G 3/3266* (2013.01); *H01L 27/322* (2013.01); *H01L 27/3211* (2013.01); *H01L 27/3276* (2013.01); *H01L 51/5234* (2013.01); *G02B 2027/0178* (2013.01); *G06F 3/011* (2013.01); *G09G 2300/0408* (2013.01); *G09G 2300/0426* (2013.01); *G09G 2300/0452* (2013.01); *G09G 2300/0842* (2013.01); *G09G 2310/08* (2013.01)

(58) Field of Classification Search
CPC .. G09G 3/3291; G09G 3/3233; G09G 3/3258; G02B 27/0172
USPC ........................................................ 345/55
See application file for complete search history.

(56) References Cited

U.S. PATENT DOCUMENTS 7,113,154 B1 * 9/2006 Inukai .................. G09G 3/2022
345/76
2013/0234326 A1 9/2013 Kim et al.
(Continued)

FOREIGN PATENT DOCUMENTS

| KR | 10-2017-0133573 A | 12/2017 |
|---|---|---|
| WO | WO 2017/193316 A1 | 11/2017 |

*Primary Examiner* — Jonathan M Blancha
(74) *Attorney, Agent, or Firm* — Fenwick & West LLP

(57) ABSTRACT

Embodiments of the present disclosure relate to a micro display device and a display integrated circuit and, more specifically, to a micro display device and a display integrated circuit, which include: a pixel array chip including a pixel array zone in which a plurality of subpixels defined by a plurality of gate lines and a plurality of data lines are arranged, and a through-zone in which a plurality of through-electrodes connected to the plurality of gate lines and the plurality of data lines in an outer area of the pixel array zone are arranged; and a driver chip including a circuit zone in which a driver circuit configured to drive the plurality of gate lines and the plurality of data lines through the plurality of through-electrodes is disposed, and thus have a high yield.

12 Claims, 10 Drawing Sheets

(51) Int. Cl.
*G09G 3/3233* (2016.01)
*G06F 3/01* (2006.01)

(56) References Cited

U.S. PATENT DOCUMENTS

| | | | |
|---|---|---|---|
| 2015/0194625 A1* | 7/2015 | Kim | H01L 51/5246 257/40 |
| 2016/0099205 A1* | 4/2016 | Kwon | H01L 25/50 361/679.21 |
| 2017/0061857 A1* | 3/2017 | Lee | H01L 25/0657 |
| 2017/0358265 A1* | 12/2017 | Wang | G09G 3/3655 |
| 2018/0061307 A1* | 3/2018 | Inoue | H01L 27/3211 |

* cited by examiner

MICRO DISPLAY DEVICE AND DISPLAY INTEGRATED CIRCUIT HAVING DUAL CHIPS STACKED WITH EACH OTHER

CROSS REFERENCE TO RELATED APPLICATION

This application claims priority to Republic of Korea Patent Application No. 10-2017-0169993, filed on Dec. 12, 2017, which is hereby incorporated by reference in its entirety.

BACKGROUND

1. Field of the Technology

The present disclosure relates to a micro display device and a display integrated circuit.

2. Description of the Prior Art

A display device includes a display panel in which a plurality of subpixels are arranged and various driver circuits, such as a source driver circuit and a gate driver circuit, which drive the display panel.

In a conventional display device, a display panel includes transistors, various electrodes, various signal lines, and the like, which are formed on a glass substrate. Driver circuits that can be implemented as an integrated circuit are mounted on a printed circuit and are electrically connected to the display panel through the printed circuit.

Such a structure is suitable for a large display device, but is not suitable for a small display device.

Meanwhile, various electronic devices such as virtual reality devices, augmented reality devices, and the like, which require small display devices, have been developed. Thus, a micro display device having a very small size has been proposed.

Generally, a micro display device is implemented in the form of a chip on a silicon substrate (silicon semiconductor substrate). Therefore, as the size of the micro display device is increased, the size of the chip is also increased, and the yield of the micro display device is thus lowered.

Recently, demands for a large screen and high resolution have increased even in a micro display device. Such demands for a large screen and high resolution result in an increase in the size of a chip, which lowers the production yield of a micro display device and increases the manufacturing cost thereof.

SUMMARY

An aspect of embodiments of the present disclosure is to provide a micro display device and a display integrated circuit which can be manufactured at low cost and in small size.

Another aspect of embodiments of the present disclosure is to provide a micro display device and a display integrated circuit which can reduce spatial constraints.

In accordance with an aspect, embodiments of the present disclosure may provide a micro display device including: a pixel array chip including a pixel array zone in which a plurality of subpixels defined by a plurality of gate lines and a plurality of data lines are arranged, and a through-zone in which a plurality of through-electrodes connected to the plurality of gate lines and the plurality of data lines in an outer area of the pixel array zone are arranged; and a driver chip including a circuit zone in which a driver circuit configured to drive the plurality of gate lines and the plurality of data lines through the plurality of through-electrodes is disposed.

The pixel array chip may be disposed on the driver chip.

The through-zone may include at least one gate through-zone in which a plurality of gate through-electrodes connected to the plurality of gate lines, among the plurality of through-electrodes, are arranged, and at least one source through-zone in which a plurality of data through-electrodes connected to the plurality of data lines, among the plurality of through-electrodes, are arranged.

The at least one gate through-zone may be disposed in a first direction side toward which the plurality of gate lines extend in the outer area of the pixel array zone, and the at least one source through-zone may be disposed in a second direction side toward which the plurality of data lines extend in the outer area of the pixel array zone.

The driver chip may further include a connection zone in which a plurality of connection ports configured to connect the plurality of through-electrodes to the driver circuit in an outer area of the circuit zone are arranged.

The connection zone may include at least one gate connection zone disposed at a position corresponding to the at least one gate through-zone, and at least one source connection zone disposed at a position corresponding to the at least one source through-zone.

The driver circuit may include at least one gate driver circuit disposed adjacent to the at least one gate connection zone in the circuit zone and configured to drive the plurality of gate lines; at least one source driver circuit disposed adjacent to the at least one source connection zone in the circuit zone and configured to drive the plurality of data lines; and a controller configured to convert image input data into image data having a predetermined format and control the at least one gate driver circuit and the at least one source driver circuit according to the image data.

The circuit zone may further include at least one pad unit in which a plurality of pads for electrically connecting the driver circuit to an external device are disposed.

The at least one pad unit may be disposed in a side of the driver chip, in which the at least one gate connection zone and the at least one source connection zone are not disposed.

The driver circuit may further include an interface unit disposed adjacent to the pad unit in the circuit zone and configured to transfer the image input data received through one or more pads of the plurality of pads to the controller.

The driver circuit may further include a power supply circuit disposed adjacent to the at least one source driver circuit in the circuit zone and configured to generate and output a driving voltage and a ground voltage from at least one power supply voltage received through two or more pads of the plurality of pads.

The power supply circuit can supply the driving voltage and the ground voltage for driving the plurality of subpixels to the pixel array chip through the through-electrodes disposed in the at least one source through-zone.

The driver circuit may further include at least one line memory disposed between the controller and the source driver circuit and configured to temporarily store the image data output from the controller and output image data stored at a designated timing to the source driver circuit.

The plurality of connection ports may be implemented by a conductive bump or a solder ball.

The plurality of subpixels may include a driver transistor including a source and a drain which are disposed on a silicon substrate of the pixel array chip, and a gate disposed in an insulating layer disposed on the silicon substrate; and an organic light emitting diode disposed on the insulating layer.

In accordance with another aspect, embodiments of the present disclosure may provide a display integrated circuit including: a silicon substrate; a plurality of subpixels arranged in a pixel array zone of the silicon substrate and defined by a plurality of gate lines and a plurality of data lines; and a plurality of through-electrodes arranged in a through-zone at an outer periphery of the pixel array zone and connected to the plurality of gate lines and the plurality of data lines.

The plurality of subpixels may be driven by a data voltage and a scan signal transferred through the plurality of through-electrodes from a separately implemented driver circuit.

Embodiments of the present disclosure as described above may provide a micro display device and a display integrated circuit which can be manufactured at low cost and in small size.

In addition, the embodiments of the present disclosure may provide a micro display device and a display integrated circuit which can reduce spatial constraints.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION OF THE EXEMPLARY EMBODIMENTS

Figure 1:
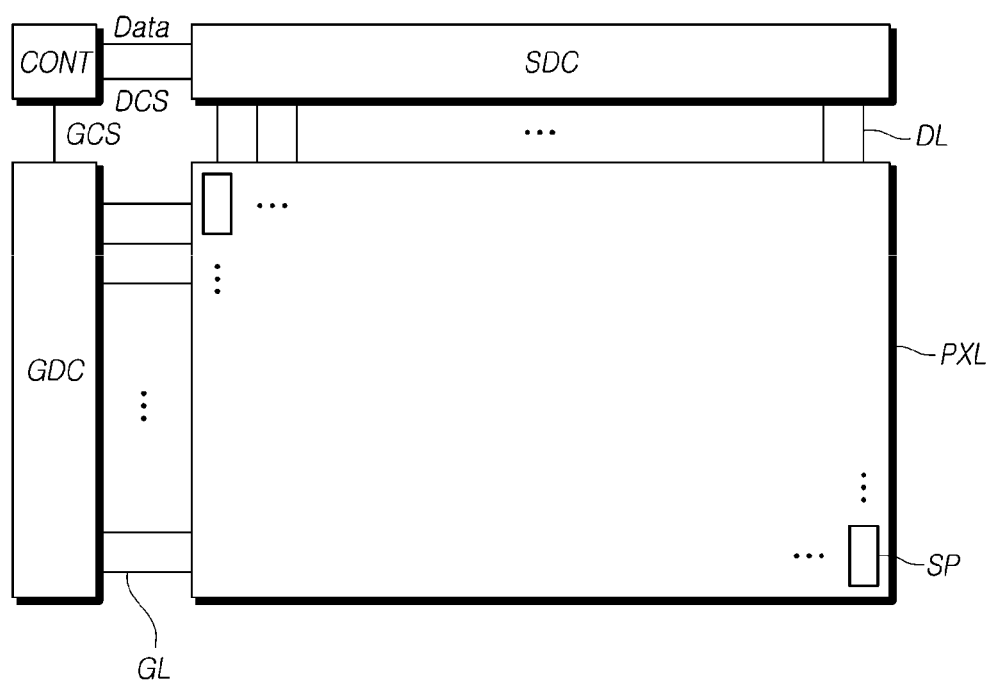
FIG. 1 illustrates a schematic system configuration of a micro display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a schematic system configuration of a micro display device according to embodiments of the present disclosure.

In the present disclosure, it is assumed that a micro display device is implemented as an organic light emitting display device, and FIG. 1 illustrates a schematic system configuration of the organic light emitting display device.

Referring to FIG. 1, a micro display device 100 includes a pixel array (PXL) in which a plurality of data lines (DL) and a plurality of gate lines (GL) are arranged and which includes a plurality of subpixels (SP) defined by the plurality of data lines (DL) and the plurality of gate lines (GL), a source driver circuit (SDC) which drives the plurality of data lines (DL), a gate driver circuit (GDC) which drives the plurality of gate lines (GL), a controller (CONT) which controls the source driver circuit (SDC) and the gate driver circuit (GDC), and the like.

The controller (CONT) supplies various control signals (DCS and GCS) to the source driver circuit (SDC) and the gate driver circuit (GDC) so as to control the source driver circuit (SDC) and the gate driver circuit (GDC).

The controller (CONT) starts scanning according to a timing implemented in each frame, converts image input data input from the outside according to a data signal format used in the source driver circuit (SDC), outputs the converted image data (Data), and controls the data driving at a proper time according to the scan.

The controller (CONT) may be a timing controller used in a general display technology or a control device which includes the timing controller and further performs another control function.

The source driver circuit (SDC) receives image data (Data) from the controller (CONT) and supplies a data voltage to the plurality of data lines (DL) so as to drive the plurality of data lines (DL). The source driver circuit (SDC) is also referred to as a data driver circuit.

The source driver circuit (SDC) may include a shift register, a latch circuit, a Digital to Analog Converter (DAC), an output buffer, and the like.

In some cases, the source driver circuit (SDC) may further include an Analog to Digital Converter (ADC).

The gate driver circuit (GDC) sequentially supplies a scan signal to the plurality of gate lines (GL) so as to sequentially drive the plurality of gate lines (GL). The gate driver circuit (GDC) is also referred to as a scan driver circuit.

The gate driver circuit (GDC) may include a shift register, a level shifter, and the like.

The gate driver circuit (GDC) sequentially supplies a scan signal of an On voltage or an Off voltage to the plurality of gate lines (GL) according to control of the controller (CONT).

When a specific gate line is opened by the gate driver circuit (GDC), the source driver circuit (SDC) converts image data (Data) received from the controller (CONT) into an analog data voltage and supplies the data voltage to the plurality of data lines (DL).

The source driver circuit (SDC) may be disposed only in one side (e.g. upper side or lower side) of the pixel array (PXL), and in some cases, may be disposed in both sides (e.g. upper side and lower side) of the pixel array (PXL) according to a driving manner, a design manner, or the like.

The gate driver circuit (GDC) may be disposed only in one side (e.g. left side or right side) of the pixel array (PXL), and in some cases, may be disposed in both sides (e.g. left side and right side) of the pixel array (PXL) according to a driving manner, a design manner, or the like.

The type and number of circuit elements included in each subpixel (SP) may be variously determined according to a provided function and a design manner.

The micro display device 100 according to embodiments of the present disclosure may be a small display device having a structure suitable for being applied to electronic devices such as a virtual reality device and an augmented reality device or having excellent display performance.

In this case, for example, the pixel array (PXL), the source driver circuit (SDC), the gate driver circuit (GDC), and the controller (CONT) may be arranged on a silicon substrate (silicon semiconductor substrate) together or separately.

In the present specification, the term "Micro" may mean that the size of a display device is small, or may mean that the size of the display device is not small, but the manufacturing process thereof is finely performed.

Figure 2:
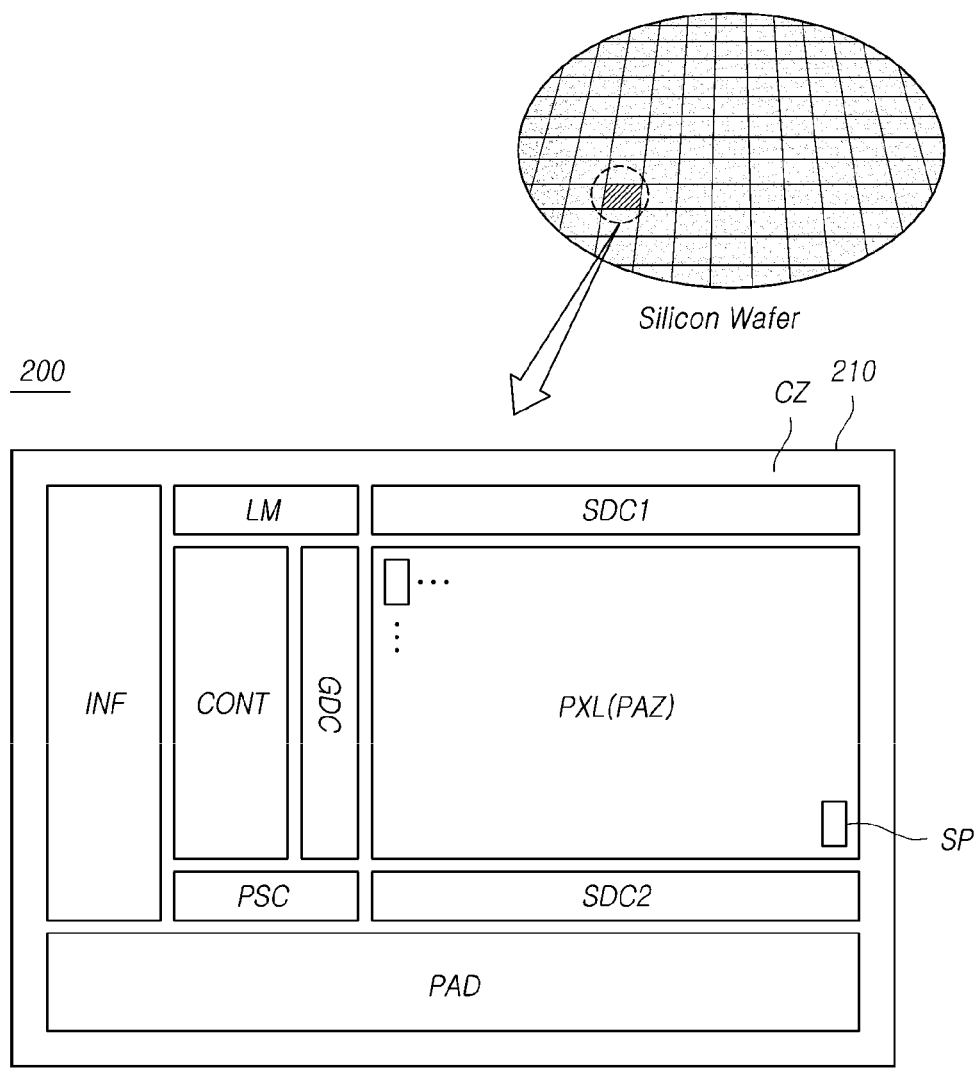
FIG. 2 illustrates a structure of a micro display device implemented on a silicon substrate according to embodiments of the present disclosure.

FIG. 2 illustrates a structure of a micro display device implemented on a silicon substrate according to embodiments of the present disclosure.

Referring to FIG. 2, a micro display device 200 according to embodiments of the present disclosure may have a backplane structure including a pixel array (PXL) and various driver circuits configured on a silicon substrate 210.

The silicon substrate 210 may be a p-type silicon substrate or a n-type silicon substrate. In the present specification, "p" means a hole and "n" means an electron.

The silicon substrate 210 may include a pixel array zone (PAZ) in which the pixel array (PXL) is disposed and a circuit zone (CZ) in which various driver circuits are disposed.

The circuit zone (CZ) of the silicon substrate 210 may be disposed around the pixel array zone (PAZ) of the silicon substrate 210. For example, the circuit zone (CZ) may exist in one side, two sides, or three sides of the pixel array zone (PAZ), and may exist while surrounding the outer periphery of the pixel array zone (PAZ).

Not only a plurality of subpixels (SP) may be arranged on the pixel array (PXL) of the silicon substrate 210 but also signal lines for supplying various signals and voltages to the plurality of subpixels (SP) may be arranged on the pixel array (PXL) of the silicon substrate 210.

The signal lines may include data lines for transferring a data voltage corresponding to an image signal, and gate lines for transferring a scan signal (gate signal).

As shown in FIG. 1, data lines (DL) may be arranged to extend in a first direction on the pixel array (PXL), and gate lines (GL) may be arranged to extend in a second direction different from the first direction.

In addition, the signal lines arranged on the pixel array (PXL) may further include a driving voltage line for transferring a driving voltage (EVDD), and in some cases, may further include a sensing line for transferring a reference voltage or for sensing a voltage.

The signal lines arranged on the pixel array (PXL) may be electrically connected to driver circuits disposed on the circuit zone (CZ) of the silicon substrate 210.

In addition, a ground voltage (EVSS) may be supplied to the pixel array (PXL). The ground voltage (EVSS) may be a kind of common voltage applied to all the subpixels (SP).

The driver circuits disposed on the circuit zone (CZ) of the silicon substrate 210 may include at least one source driver circuit (SDC1 and SDC2) for driving the data lines, at least one gate driver circuit (GDC) for driving the gate lines, and a controller (CONT) for controlling operations of the source driver circuits (SDC1 and SDC2) and the gate driver circuit (GDC).

The driver circuits disposed on the circuit zone (CZ) of the silicon substrate 210 may further include at least one line memory (LM) which temporarily stores image data output from the controller (CONT) and outputs image data stored at a timing designated by the controller (CONT) to the source driver circuits (SDC1 and SDC2).

The line memory (LM) may be disposed inside or outside the source driver circuits (SDC1 and SDC2) and may be disposed between the controller (CONT) and the source driver circuits (SDC1 and SDC2) when disposed outside the source driver circuits (SDC1 and SDC2).

The driver circuits disposed on the circuit zone (CZ) may further include a power supply circuit (PSC) for providing various signals and voltages required for driving the subpixels (SP) arranged in the pixel array (PXL) to other circuits (SDC1, SDC2, GDC, and CONT) or supplying the same to the pixel array (PXL).

The power supply circuit (PSC) may include a power generator such as a DC-DC converter, and generate and output various voltages required by the pixel array (PXL) from various power supply voltages supplied from the outside.

For example, the power supply circuit (PSC) may generate and output a driving voltage (EVDD) and a ground voltage (EVSS) for driving the subpixels.

Further, the driver circuits disposed on the circuit zone (CZ) of the silicon substrate 210 may include an interface unit (INF) for signal input/output or communication with other external electronic devices or electronic components.

The interface unit may include, for example, at least one of a low-voltage differential signaling (LVDS) interface, a mobile industry processor interface (MIPI), a serial interface, and the like.

In addition, a pad unit (PAD) including a plurality of pads may be disposed on the circuit zone (CZ) of the silicon substrate 210 to electrically connect another electronic component outside the silicon substrate 210 to the driver circuits.

The plurality of pads of the pad unit (PAD) can be used for signal input/output, power supply, or communication. Although FIG. 2 illustrates that the pad unit (PAD) is disposed in only one side of the silicon substrate 210, the pad unit (PAD) may be disposed in various positions and may be dispersed in various positions. The pad unit (PAD) may be disposed in the edge side of the silicon substrate 210 to facilitate electrical connection to another electronic component and arrangement design of driver circuits.

According to the foregoing, the micro display device 200 includes the driver circuits such as the source driver circuits (SDC1 and SDC2), the gate driver circuit (GDC), the controller (CONT), the power supply circuit (PSC), and the pixel array (PXL), all of which may be arranged on the silicon substrate 210, to reduce the size of a device and enable rapid progression of the manufacturing process thereof.

Meanwhile, the gate driver circuit (GDC) may exist only in one side with reference to the pixel array (PXL), or in both sides (left side and right side, or upper side and lower side).

In addition, the source driver circuits (SDC1 and SDC2) may exist only in one side with reference to the pixel array (PXL) or in both sides (upper side and lower side, or left side and right side).

In FIG. 2, for example, two source driver circuits (SDC1 and SDC2) are arranged in the upper side and lower side of the pixel array (PXL).

In this case, the two source driver circuits (SDC1 and SDC2) can alternately drive the plurality of data lines (DL). For example, a first source driver circuit (SDC1) can drive data lines (DL) for odd-numbered pixels (or subpixels), and a second source driver circuit (SDC2) can drive data lines (DL) for even-numbered pixels (or subpixels).

In the case where one source driver circuit (SDC) is disposed in one side (e.g. upper side) of the pixel array (PXL) in the micro display device 200, the controller (CONT) may be disposed in the other side (e.g. lower side) of the pixel array (PXL). That is, the position of the controller (CONT) may be variously adjusted.

The entire or a part of the micro display device 200 according to embodiments of the present disclosure described above can be manufactured in a process of manufacturing a silicon wafer.

In this regard, the entire or a part of the micro display device 200 according to embodiments of the present disclosure may be regarded as a kind of an integrated circuit made through a silicon wafer manufacturing process (semiconductor process).

Therefore, the entire or a part of the micro display device 200 according to embodiments of the present disclosure may be referred to as a display integrated circuit.

As described above, since the entire or a part of the micro display device 200 according to embodiments of the present disclosure is manufactured through a silicon wafer manufacturing process, it is advantageous in that the micro display device can be manufactured with precision and ease.

Meanwhile, the pixel array (PXL) including a transistor on the pixel array zone (PAZ) on the silicon substrate 210 and the driver circuits including a transistor on the circuit zone (CZ) of the silicon substrate 210 may be manufactured in the same process.

Since the micro display device 200 is formed in the form of an Integrated Circuit (IC) on the silicon substrate, the size of the micro display device 200 is required to be reduced in order to increase the production yield thereof and reduce the manufacturing cost thereof.

In FIG. 2, the source driver circuits (SDC1 and SDC2) and the gate driver circuit (GDC) are arranged in the outer area of the pixel array zone (PAZ), and the controller (CONT) is disposed between the source driver circuits (SDC1 and SDC2) or the gate driver circuit (GDC) and the interface unit (INF). In addition, the interface unit (INF) and the power supply circuit (PSC) are disposed adjacent to the pad unit (PAD), so that the arrangement structure is designed so as to improve the wiring efficiency of various signal lines and thus reduce the size of the micro display device 200.

However, the micro display device 200 shown in FIG. 2 is implemented by forming the driver circuit together with the pixel array (PXL) on the same silicon substrate (silicon semiconductor substrate).

The size of the pixel array zone (PAZ) in which the pixel array (PXL) is disposed cannot be reduced due to the characteristics of the micro display device 200.

Rather, the size of the pixel array zone (PAZ) has been gradually increased as the demands for a large screen and high resolution are increased.

Therefore, the size of the circuit other than the pixel array zone (PAZ), that is, the size of the circuit zone (CZ) in which the driver circuit is disposed is required to be reduced.

However, in order to reduce the size of the circuit zone (CZ), it is necessary to manufacture the driver circuit with a high-precision fine process, which is another factor of cost increase.

In addition, recent display devices employ various techniques for improving image quality, including a technique for compensating a characteristic value deviation between subpixels (SP) of a pixel array (PXL). Accordingly, the demands for a variety of image quality improvement techniques have been increased in the micro display device 200 as well. That is, the size of the circuit zone (CZ) is also required to be gradually increased.

As a result, since both the size of the pixel array zone (PAZ) and the size of the circuit zone (CZ) are required to be increased, the micro display device 200 shown in FIG. 2 is limited in size reduction. That is, the production yield of the micro display device is greatly reduced, and the manufacturing cost thereof is increased.

Figure 3:
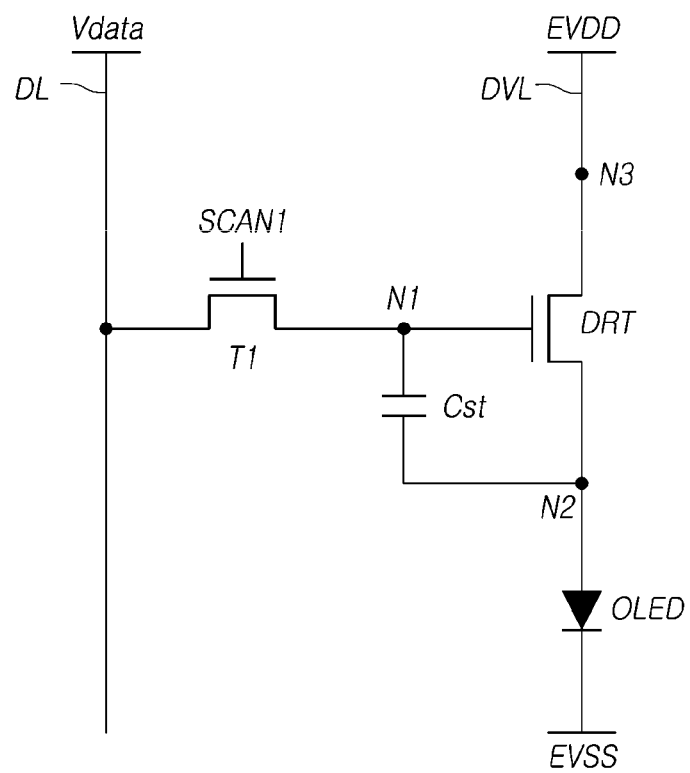
FIG. 3 illustrates a subpixel structure of a micro display device 200 according to embodiments of the present disclosure.

FIG. 3 illustrates a subpixel structure of the micro display device 200 according to embodiments of the present disclosure.

Referring to FIG. 3, in the micro display device 200 according to embodiments of the present disclosure, each subpixel (SP) may include an organic light emitting diode (OLED), a driver transistor (DRT) which drives the organic light emitting diode (OLED), a first transistor (T1) electrically connected between a first node (N1) of the driver transistor (DRT) and a data line (DL), and a capacitor (Cst) electrically connected between the first node (N1) and a second node (N2) of the driver transistor (DRT).

The organic light emitting diode (OLED) may include a first electrode (e.g. an anode electrode or a cathode electrode), an organic emission layer (OEL), a second electrode (e.g. a cathode electrode or an anode electrode), and the like.

The first electrode of the organic light emitting diode (OLED) may be electrically connected to the second node (N2) of the driver transistor (DRT). A ground voltage (EVSS) may be applied to the second electrode of the organic light emitting diode (OLED).

The ground voltage (EVSS) may be a kind of common voltage applied to all the subpixels (SP).

The driver transistor (DRT) drives the organic light emitting diode (OLED) by supplying a driving current (Ioled) to the organic light emitting diode (OLED).

The driver transistor (DRT) has a first node (N1), a second node (N2), and a third node (N3).

The first node (N1) of the driver transistor (DRT) is a node corresponding to a gate node and may be electrically connected to a source node or a drain node of the first transistor (T1).

The second node (N2) of the driver transistor (DRT) may be electrically connected to the first electrode of the organic light emitting diode (OLED) and may be a source node or a drain node.

The third node (N3) of the driver transistor (DRT) is a node to which a driving voltage (EVDD) is applied, may be electrically connected to a driving voltage line (DVL) for supplying the driving voltage (EVDD), and may be a drain node or a source node.

The driving voltage (EVDD) may be a kind of common voltage applied to all the subpixels (SP).

The first transistor (T1) may be turned on or off by receiving a first scan signal (SCAN1) into the gate node thereof through a gate line.

The first transistor (T1) may be turned on by the first scan signal (SCAN1) to transfer a data voltage (Vdata) supplied from the data line (DL) to the first node (N1) of the driver transistor (DRT).

The first transistor (T1) is also referred to as a switching transistor.

The capacitor (Cst) is electrically connected between the first node (N1) and the second node (N2) of the driver transistor (DRT), so that the data voltage (Vdata) corresponding to an image signal voltage or a voltage corresponding thereto can be maintained during one frame period.

As described above, one subpixel (SP) illustrated in FIG. 3 may have a 2 transistor, 1 capacitor (2T1C) structure including two transistors (DRT) and one capacitor (Cst) in order to drive the organic light emitting diode (OLED).

The subpixel structure (2T1C structure) illustrated in FIG. 3 is only an example for convenience of explanation, and one subpixel (SP) may further include one or more transistors, or one or more capacitors according to a function, a panel structure, or the like.

For example, the subpixel may further include at least one transistor connected to a sensing line to sense a characteristic value of the driver transistor (DRT) or the organic light emitting diode (OLED).

This is a structure for compensating the deviation between subpixels so as to improve the image quality of the micro display device.

Meanwhile, the capacitor (Cst) may be an intentionally designed external capacitor outside the driver transistor (DRT) rather than a parasitic capacitor (e.g. Cgs or Cgd) corresponding to an internal capacitor existing between the second node (N2) and the first node (N1) of the driver transistor (DRT).

Each of the driver transistor (DRT) and the first transistor (T1) may be an n-type transistor or a p-type transistor.

Further, in some cases, each of the plurality of subpixels may have the same structure, and some of the plurality of subpixels may have different structures.

Figure 4:
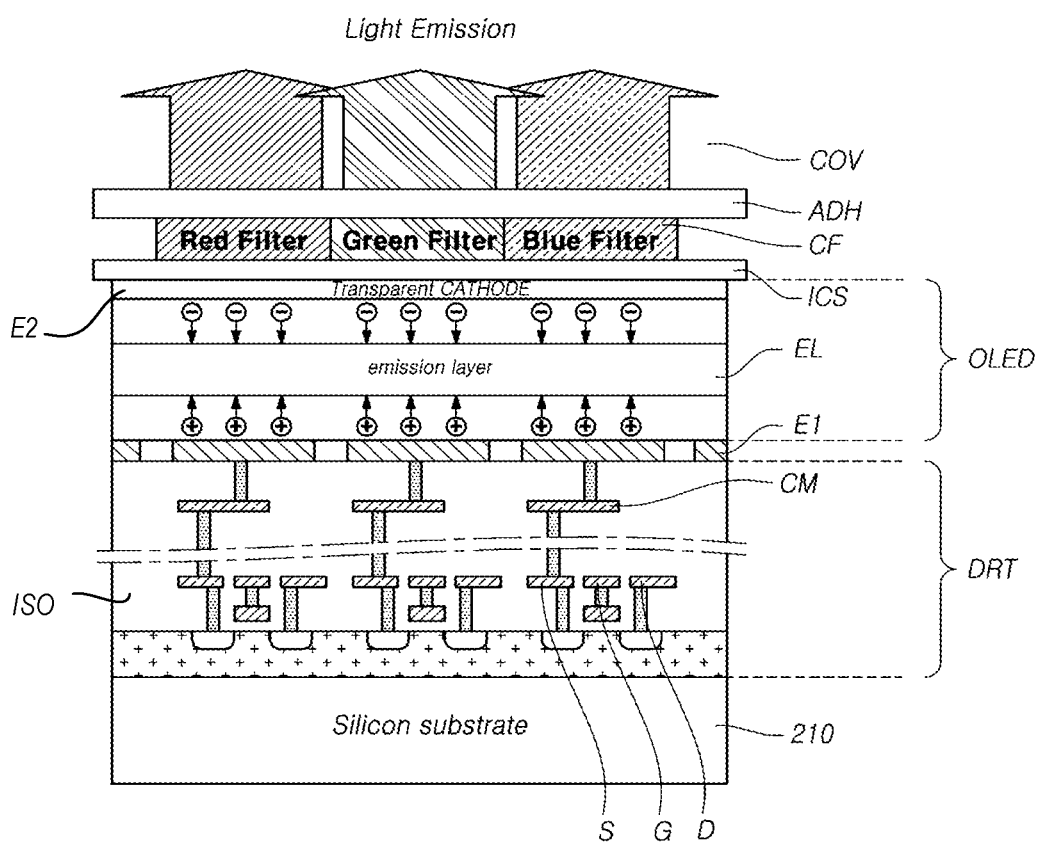
FIG. 4 is a cross-sectional view illustrating a pixel structure of a micro display device according to embodiments of the present disclosure.

FIG. 4 is a cross-sectional view illustrating a pixel structure of a micro display device according to embodiments of the present disclosure.

FIG. 4 illustrates an example of a pixel structure in which red (R), green (G), and blue (B) subpixels configure one pixel.

In FIG. 4, the silicon substrate 210 may be a p-type substrate or an n-type substrate. For example, the silicon substrate 210 may be a p-type substrate herein.

An insulating layer (ISO) is disposed on the silicon substrate 210, and a gate electrode (G), a source electrode (S), and a drain electrode (D) are disposed in the insulating layer (ISO).

Further, the driver transistor (DRT) is disposed on the silicon substrate 210.

A source and a drain of the driver transistor (DRT) may be disposed at positions corresponding to the source electrode (S) and the drain electrode (D) on the silicon substrate 210.

A gate of the driver transistor (DRT) is disposed in the insulating layer (ISO) and is disposed at a position corresponding to the gate electrode (G).

The gate, the source, and the drain of the driver transistor (DRT) may be electrically connected to the gate electrode (G), the source electrode (S), and the drain electrode (D) through a contact hole, respectively.

Meanwhile, a contact metal (CM) disposed in the insulating layer (ISO) may be connected to the source electrode (S) or the drain electrode (D) through the contact hole of the insulating layer (ISO). The contact metal (CM) may be a sensing line (SL).

Meanwhile, the first electrode (E1) of the organic light emitting diode (OLED) may be disposed on the insulating layer (ISO). The first electrode (E1) may be electrically connected to the contact metal (CM) through the contact hole of the insulating layer (ISO). The first electrode (E1) may be an anode electrode of the organic light emitting diode (OLED).

An emission layer (EL) may be disposed on the first electrode (E1), and the second electrode (E2) of the organic light emitting diode (OLED) may be disposed on the emission layer (EL). The second electrode (E2) may be a cathode electrode of the organic light emitting diode (OLED).

As shown in FIG. 4, the second electrode (E2) may be a common electrode formed commonly in a plurality of subpixels.

The organic light emitting diode (OLED) is implemented by the first electrode (E1), the emission layer (EL), and the second electrode (E2).

A protection layer (ICS) may be disposed on the second electrode (E2), and a color filter layer (CF) may be disposed on the protection layer (ISC). The color filter layer (CF) may include a red filter, a green filter, and a blue filter in order to implement red (R), green (G), and blue (B) subpixels.

A protective cover (COV) may be disposed on the color filter layer (CF). The protective cover (COV) may be attached by an adhesive layer (ADH).

In FIG. 4, as an example of a micro display device, the emission layer (EL) is configured to emit light of a single color. The color filter layer (CF) enables the light emitted from the emission layer (EL) to express a red (R), green (G), or blue (B) light corresponding to each subpixel. The emission layer (EL) can emit white light.

However, as another example, a plurality of different emission layers emitting red (R), green (G), and blue (B) lights are arranged corresponding to subpixels, respectively, so that each of the subpixels may be configured to express red (R), green (G), or blue (B) light. In this case, the color filter layer (CF) may be omitted.

In FIG. 4, three subpixels corresponding to red (R), green (G), and blue (B) configure one pixel, but one pixel may be configured to have four subpixels. For example, four subpixels may be subpixels that emit red (R), green (G), blue (B), and white (W) light, respectively.

In such the micro display device, in general, an organic light emitting diode (OLED) may be formed through a deposition manner after various circuit elements of subpixels including a driver transistor (DRT) are formed on a silicon substrate 210.

Figure 5:
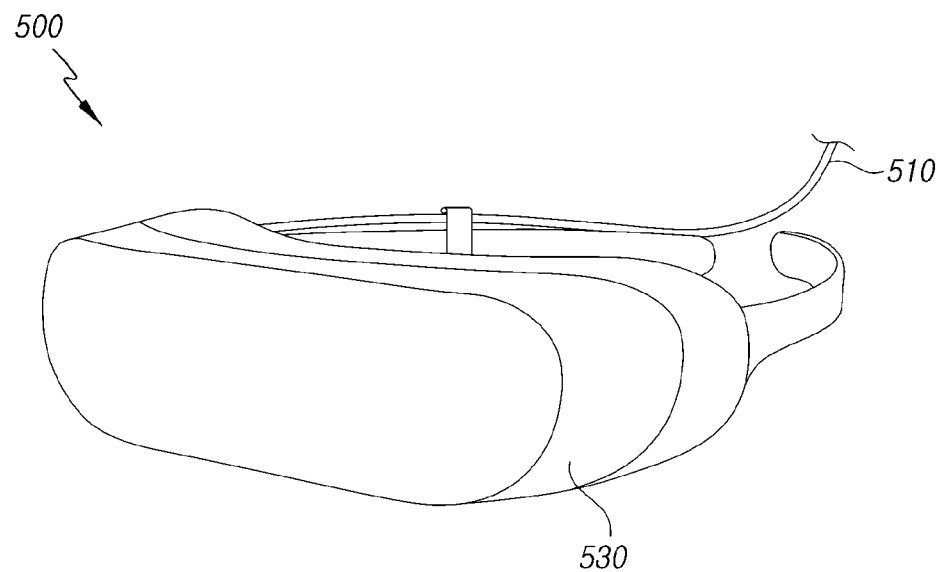
FIG. 5 illustrates an example of an electronic device using a micro display device according to embodiments of the present disclosure.
Figure 5:
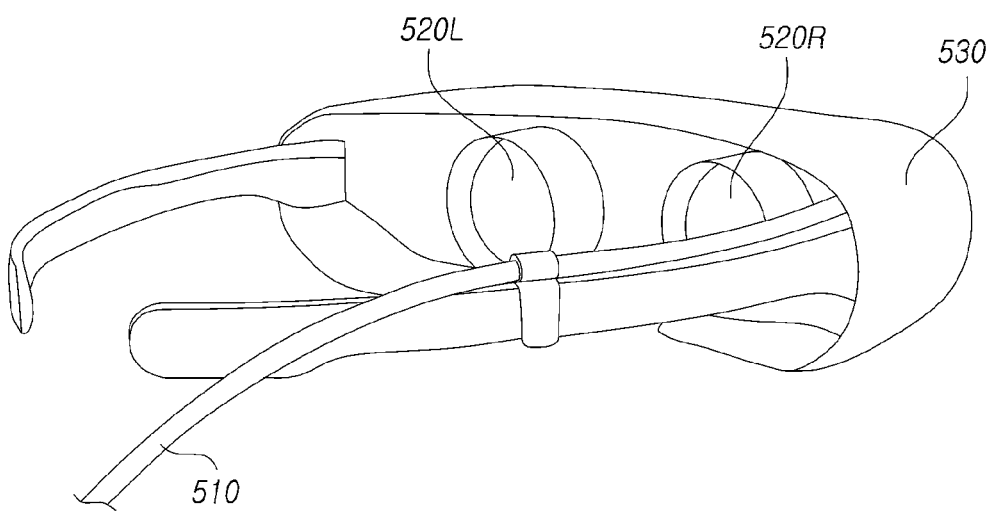

FIG. 5 illustrates an example of an electronic device using a micro display device according to embodiments of the present disclosure.

Referring to FIG. 5, an electronic device 500 according to embodiments of the present disclosure is a head mounted display type device (HMD) that is a kind of wearable device for displaying an augmented reality image or a virtual reality image.

The electronic device 500 according to embodiments of the present disclosure may include an image signal input unit 510 to which image data is input, a first display device 520L on which a first image (e.g. a left eye image) based on an image signal is displayed, a second display device 520R on which a second image (e.g. a right eye image) based on the image signal is displayed, and a case 530 which houses the image signal input unit 510, the first display device 520L, and the second display device 520R.

The image signal input unit 510 may include a wired cable or a wireless communication module connected to a terminal (e.g. a smart phone or the like) which outputs image data.

The first display device 520L and the second display device 520R are located at positions corresponding to the left and right eyes of a user, respectively.

Each of the first display device 520L and the second display device 520R may include the entire or a part of the micro display device 200.

Figure 6:
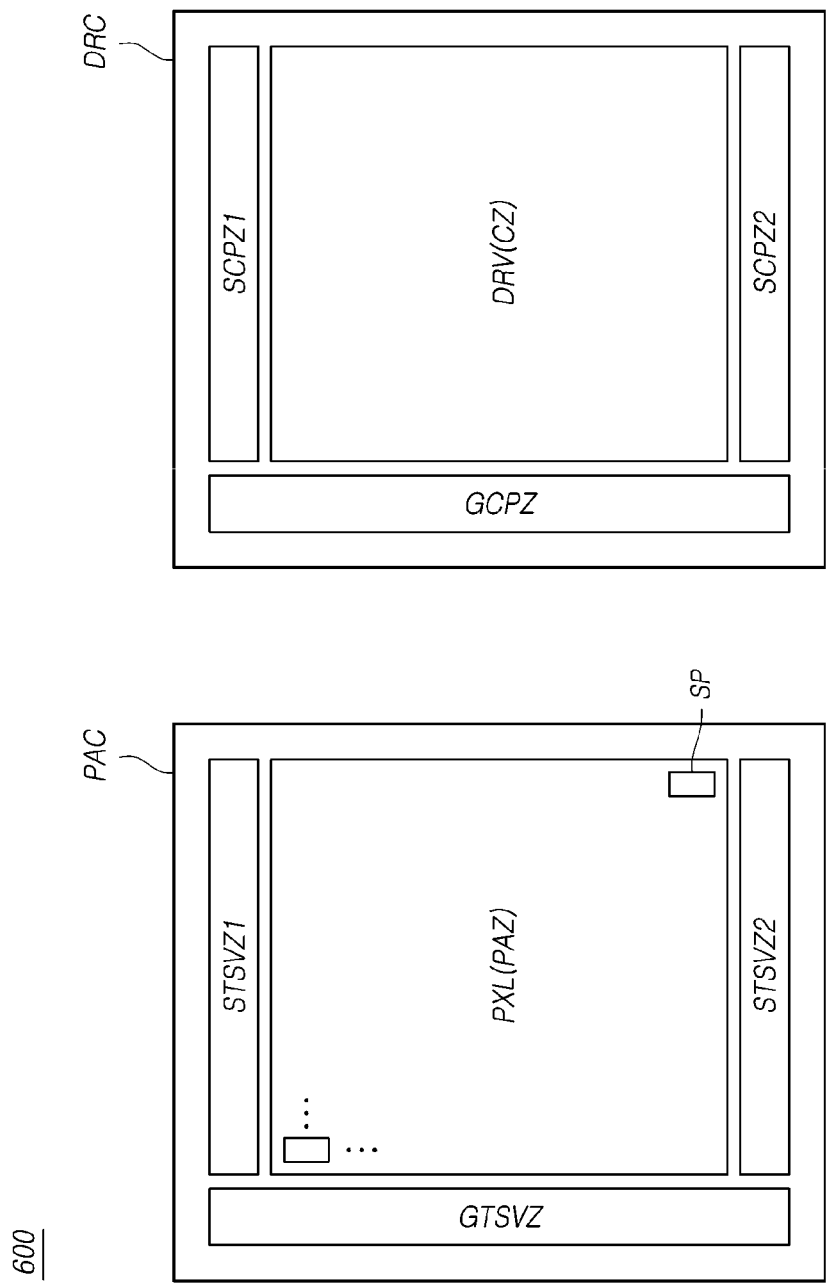
FIGS. 6 and 7 illustrate a schematic structure of a micro display device according to other embodiments of the present disclosure.
Figure 7:
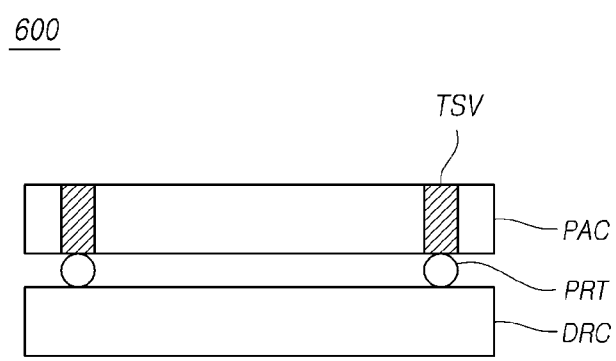

FIGS. 6 and 7 illustrate a schematic structure of a micro display device according to other embodiments of the present disclosure.

FIG. 6 schematically illustrates a structure of a micro display device 600, and FIG. 7 illustrates the arrangement structure of two or more chips in the micro display device 600 of FIG. 6.

Unlike the micro display device 200 of FIG. 2, which is implemented as a single chip wherein all components are arranged on one silicon substrate 210, the micro display device 600 of FIG. 6 includes two or more silicon substrates. That is, the micro display device 600 includes two or more chips.

In this case, one chip is a pixel array chip (PAC) including a pixel array zone (PAZ) and the other chip is a driver chip (DRC) including a circuit zone (CZ).

A plurality of subpixels (SP) defined by a plurality of gate lines and a plurality of data lines are arranged in the pixel array zone (PAZ) of the pixel array chip (PAC).

A driver circuit (DRV) for driving the plurality of gate lines (GL) and the plurality of data lines (DL) is disposed in the circuit zone (CZ) of the driver chip (DRC).

That is, as noted from the drawings, the pixel array zone (PAZ) and the circuit zone (CZ) in the micro display device 200 of FIG. 2 are separately implemented as separate chips (silicon substrates) in the micro display device 600 of FIG. 6.

As shown in FIG. 7, the micro display device 600 according to embodiments of the present disclosure includes a pixel array chip (PAC) and a driver chip (DRC) which are stacked with each other. That is, the pixel array chip (PAC) is disposed on the driver chip (DRC).

Meanwhile, the pixel array chip (PAC) includes a through-zone in the outer area of the pixel array zone (PAZ). For example, the through-zone may exist in one side, two sides, or three sides of the pixel array zone (PAZ), or may exist while surrounding the outer periphery of the pixel array zone (PAZ).

A plurality of through-electrodes (Through Silicon Vias (TSVs)) electrically connected to the plurality of gate lines and the plurality of data lines are disposed in the through-zone.

As is known, the through-electrode (TSV) is an electrical connecting line which is implemented by filling a conductive material in a fine hole extending through a silicon wafer and extends through the inside of a chip.

Accordingly, the plurality of through-electrodes (TSV) arranged in the through-zone extend through the plurality of gate lines and the plurality of data lines arranged on the pixel array chip (PAC) up to a lower portion of the pixel array chip (PAC), and electrically connect the plurality of gate lines and the plurality of data lines.

The plurality of through-electrodes may be divided into a gate through-electrode and a data through-electrode according to a connected line.

The through-zone may include at least one gate through-zone (GTSVZ) in which a plurality of gate through-electrodes connected to the plurality of gate lines, among the plurality of through-electrodes, are disposed and at least one source through-zone (STSVZ1 and STSVZ2) in which a plurality of data through-electrodes connected to the plurality of data lines, among the plurality of through-electrodes, are disposed.

The at least one gate through-zone (GTSVZ) may exist only in one side with reference to the pixel array zone (PAZ) or in both sides (left side and right side, or upper side and lower side).

The at least one source through-zone (STSVZ1 and STSVZ2) may exist only in one side with reference to the pixel array zone (PAZ) or in both sides (left side and right side, or upper side and lower side).

That is, the at least one gate through-zone (GTSVZ) may be disposed in a first direction side toward which the plurality of gate lines (GL) extend in the outer area of the pixel array zone (PAZ), and the at least one source through-zone (STSVZ1 and STSVZ2) may be disposed in a second direction side toward which the plurality of data lines (DL) extend in the outer area of the pixel array zone (PAZ).

The number and arrangement position of the gate through-zone (GTSVZ) and the source through-zones (STSVZ1 and STSVZ2) may be determined according to the number and the arrangement position of at least one gate driver circuit (GDC) and at least one source driver circuit (SDC1 and SDC2) disposed in the circuit zone (CZ) of the driver chip (DRC).

The driver chip (DRC) includes a connection zone in the outer area of the circuit zone (CZ). For example, the connection zone may exist in one side, two sides, or three sides of the circuit zone (CZ), or may exist while surrounding the outer periphery of the circuit zone (CZ).

The connection zone is disposed at a position corresponding to a position of the through-zone of the pixel array chip (PAC).

A plurality of connection ports (PRT) electrically connecting a plurality of through-electrodes and a driver circuit (DRV) disposed in the circuit zone (CZ) are arranged in the connection zone.

The plurality of connection ports (PRT) may be implemented by at least one of a conductive bump, a solder ball, and a conductive spacer arranged in alignment with the through-electrodes on the driver chip (DRC).

Therefore, as shown in FIG. 7, the plurality of connection ports (PRT) may electrically connect the driver chip (DRC) and the through-electrodes of the pixel array chip (PAC), which are stacked and spaced apart from each other.

The connection zone may include at least one gate connection zone (GCPZ) disposed at a position corresponding to the at least one gate through-zone (GTSVZ), and at least one source connection zone (SCPZ1 and SCPZ2) disposed at a position corresponding to the at least one source through-zone (STSVZ1 and STSVZ2).

That is, in the stacked pixel array chip (PAC) and driver chip (DRC), the at least one gate through-zone and the at least one gate connection zone (GCPZ) are arranged to match each other, and the at least one source through-zone (STSV1 and STSV2) and the at least one source connection zone (SCPZ1 and SCPZ2) are arranged to match each other.

The micro display device 600 shown in FIGS. 6 and 7 includes a pixel array zone (PAZ) and a circuit zone (CZ), which are separately implemented in the pixel array chip (PAC) and the driver chip (DRC) separate from each other. Therefore, the size of the pixel array chip (PAC) is determined by the size of the pixel array zone (PAZ), but is not affected by the size of the circuit zone (CZ).

Meanwhile, since the gate connection zone (GCPZ) and the source connection zones (SCPZ1 and SCPZ2) are required to be arranged corresponding to the source through-zones (STSVZ1 and STSVZ2) and the gate through-zone (GTSVZ) of the pixel array chip (PAC), the size of the driver chip (DRC) may be the same as the pixel array chip (PAC) or larger than the pixel array chip (PAC).

That is, the size of the circuit zone (CZ) included in the driver chip (DRC) can be freely extended, and thus the driver circuit (DRV) disposed in the circuit zone (CZ) can be designed to perform various functions.

In the micro display device 200 shown in FIG. 2, the size of the pixel array zone (PAZ) is actually much larger than the size of the circuit zone (CZ). Therefore, even when the size of the driver chip (DRC) is the same as that of the pixel array chip (PAC), the driver circuit (DRV) can be easily designed.

The gate connection zone (GCPZ) and the source connection zones (SCPZ1 and SCPZ2) are required to be arranged corresponding to the gate through-zone (GTSVZ) and the source through-zones (STSVZ1 and STSVZ2). Therefore, in order to facilitate the design, the size of the circuit zone (CZ) may be equal to the size of the pixel array zone (PAZ).

In addition, since the pixel array chip (PAC) and the driver chip (DRC) are separated from each other, the size of each of the pixel array chip (PAC) and the driver chip (DRC) can be greatly reduced as compared with a case having the same pixel array zone (PAZ) as that of the micro display device 200 of FIG. 2. That is, the micro display device can have increased yield and thus be manufactured at low cost.

Figure 8:
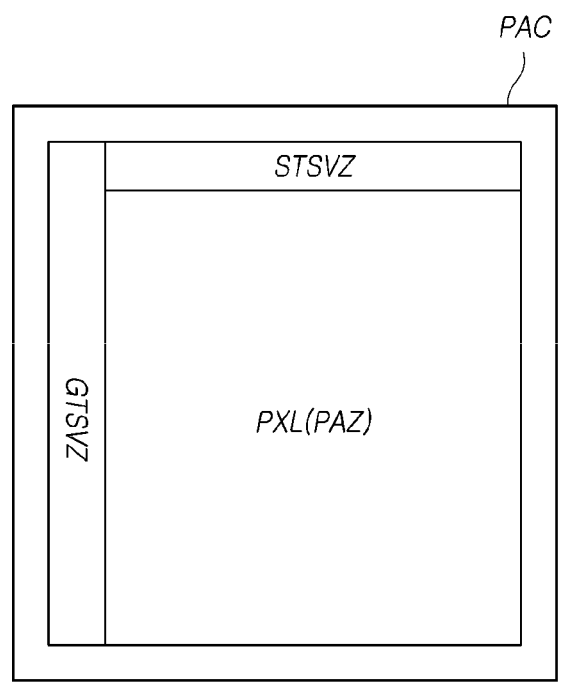
FIGS. 8 and 9 illustrate various examples of arrangement of through-zones in a micro display device according to embodiments of the present disclosure.
Figure 9:
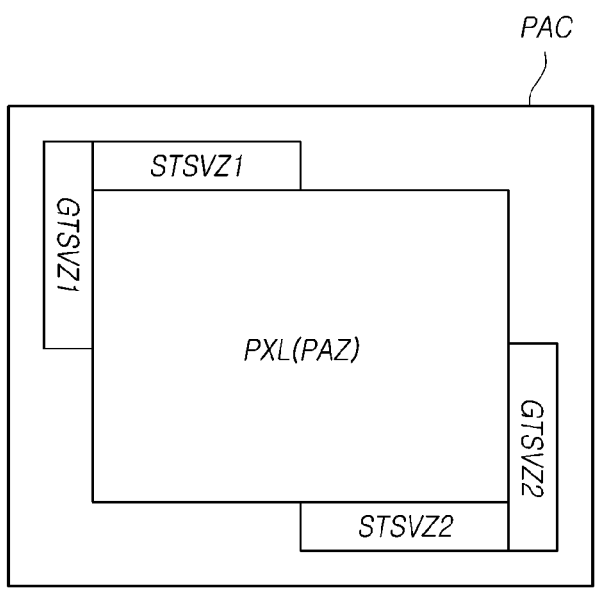

FIGS. 8 and 9 illustrate various examples of arrangement of through-zones in a micro display device according to embodiments of the present disclosure.

In FIG. 6, for example, one gate through-zone (GTSVZ) is disposed in the left side of the pixel array zone (PAZ), and two source through-zones (STSVZ1 and STSVZ2) are disposed in the upper side and lower side of the pixel array zone (PAZ).

However, as shown in FIG. 8, the pixel array chip (PAC) may include only one gate through-zone (GTSVZ) and one source through-zone (STSVZ), or may include two gate through-zones (GTSVZ1 and GTSVZ2) and two source through-zones (STSVZ1 and STSVZ2).

In particular, as shown in FIG. 9, the gate through-zones (GTSVZ1 and GTSVZ2) and the source through-zones (STSVZ1 and STSVZ2) do not need to be sized corresponding to the size of the pixel array zone (PAZ).

Further, although not shown, each of a plurality of gate through-zones and a plurality of source through-zones may be separately included in one side of the pixel array zone (PAZ).

For example, two or more separated gate through-zones may be disposed in the left side of the pixel array zone (PAZ), and two or more separated source through-zones may be disposed in the lower side of the pixel array zone (PAZ).

That is, in the embodiments of the present disclosure, the number and position of the gate through-zone (GTSVZ) and the source through-zone (STSVZ) may be variously configured.

Meanwhile, as described above, the number and position of the gate through-zone (GTSVZ) and the source through-zone (STSVZ) may be determined according to the number and the arrangement position of at least one gate driver circuit (GDC) and at least one source driver circuit (SDC1 and SDC2) included in the circuit zone (CZ).

Figure 10:
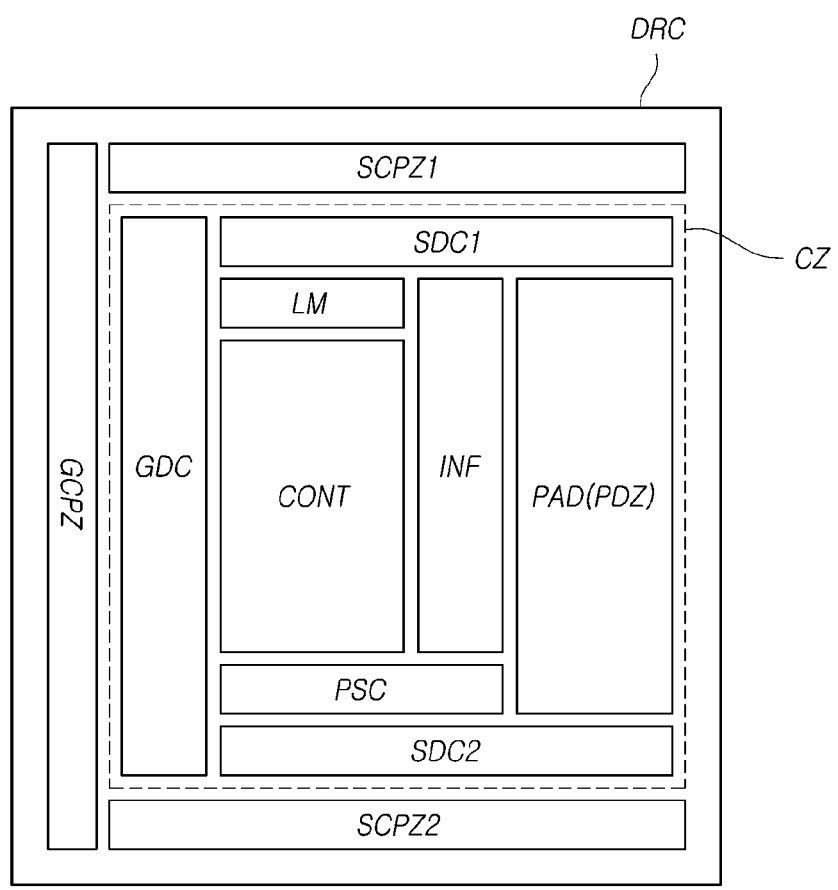
FIG. 10 schematically illustrates a configuration of a circuit zone of a driver chip of FIG. 6 according to embodiments of the present disclosure.

FIG. 10 schematically illustrates a configuration of a circuit zone of the driver chip of FIG. 6 according to embodiments of the present disclosure.

The configuration of the driver circuit (DRV) included in the circuit zone (CZ) of FIG. 10 is basically the same as that of the driver circuit included in the circuit zone (CZ) of FIG. 2.

However, since the pixel array chip (PAC) and the driver chip (DRC) are separated from each other in the micro display device 600 of FIG. 6, the arrangement positions of components of the driver circuit (DRV) disposed in the circuit zone (CZ) in FIG. 10 are different from the arrangement positions of components of the driver circuit (DRV) disposed in the circuit zone (CZ) in FIG. 2.

Referring to FIG. 10, the driver circuit (DRV) includes at least one gate driver circuit (GDC) which drives a plurality of gate lines (GL), at least one source driver circuit (SDC1 and SDC2) which drives a plurality of data lines (DL), and a controller (CONT) which converts image input data into image data having a predetermined format and controls the at least one gate driver circuit (GDC) and the at least one source driver circuit (SDC1 and SDC2) according to the image data.

The detailed operation of each of the at least one gate driver circuit (GDC), the at least one source driver circuit (SDC1 and SDC2), and the controller (CONT) has already been described and will not be described in detail here.

Meanwhile, as shown in FIG. 10, the at least one gate driver circuit (GDC) is disposed adjacent to at least one gate connection zone (GCPZ) in the circuit zone (CZ), and the at least one source driver circuit (SDC1 and SDC2) is disposed adjacent to at least one source connection zone (SCPZ1 and SCPZ2) in the circuit zone (CZ).

In order to easily drive a plurality of gate lines (GL) through a plurality of gate through-electrodes and a plurality of gate connection ports of the corresponding gate connection zone (GCPZ), the gate driver circuit (GDC) is disposed adjacent to at least one gate connection zone (GCPZ).

Similarly, in order to easily drive a plurality of data lines (DL) through a plurality of source through-electrodes and a plurality of source connection ports of the corresponding source connection zones (SCPZ1 and SCPZ2), the source driver circuits (SDC1 and SDC2) are disposed adjacent to at least one source connection zone (SCPZ1 and SCPZ2).

The driver chip (DRC) may further include at least one pad unit (PAD) having a plurality of pads arranged therein and electrically connecting the driver circuit (DRV) to an external device.

The at least one pad unit (PAD) may be disposed in a side of the driver chip, where at least one gate connection zone (GCPZ) and at least one source connection zone (SCPZ1 and SCPZ2) are not disposed.

The pad unit (PAD) may be disposed in a side where at least one gate connection zone (GCPZ) and at least one source connection zone (SCPZ1 and SCPZ2) are not disposed, such that the plurality of pads can be easily connected to an external device without being affected by the gate connection zone (GCPZ) and the source connection zones (SCPZ1 and SCPZ2).

Meanwhile, the driver circuit (DRV) may include an interface unit (INF) which performs signal input/output or communication with other external electronic devices or electronic components through one or more pads of the plurality of pads.

The interface unit (INF) may be disposed adjacent to the pad unit (PAD) in the circuit zone (CZ) and transfer image input data received through one or more pads of the plurality of pads to the controller (CONT).

For example, the interface unit (INF) may include at least one of a low-voltage differential signaling (LVDS) interface, a mobile industry processor interface (MIPI), a serial interface, and the like.

The driver circuit (DRV) may further include a power supply circuit (PSC) for providing various signals and voltages required for driving subpixels (SP) arranged in the pixel array (PXL) to other circuits (SDC1, SDC2, GDC, and CONT) or supplying the same to the pixel array (PXL).

The power supply circuit (PSC) may be disposed adjacent to at least one source driver circuit (SDC1 and SDC2) in the circuit zone (CZ) and generate and output a driving voltage (EVDD) and a ground voltage (EVSS) from at least one power supply voltage received through two or more pads of the plurality of pads.

The power supply circuit may supply the driving voltage (EVDD) and the ground voltage (EVSS) for driving the plurality of subpixels (SP) to the pixel array chip (PAC) through through-electrodes disposed in at least one source through-zone (STSVZ1 and STSVZ2).

The power supply circuit (PSC) may include a power generator such as a DC-DC converter.

The driver circuit (DRV) may further include at least one line memory (LM) which is disposed between the controller (CONT) and the source driver circuits (SDC1 and SDC2), temporarily stores image data output from the controller (CONT), and outputs image data stored at a designated timing to the source driver circuits (SDC1 and SDC2).

In FIG. 10, only one line memory (LM) is shown as an example, but a plurality of line memories (LM) may be arranged corresponding to the source driver circuits (SDC1 and SDC2).

As a result, the micro display device 600 according to embodiments of the present disclosure includes a pixel array zone (PAZ) and a circuit zone (CZ), which are separately implemented in the pixel array chip (PAC) and the driver chip (DRC) separate from each other, to reduce the chip size of each of the pixel array chip (PAC) and the driver chip (DRC), so that the micro display device can have increased yield and thus be manufactured at low cost.

In addition, the size of the circuit zone (CZ) can be expanded, and the driver circuit disposed in the circuit zone (CZ) can be designed to perform various functions.

Meanwhile, in the embodiments of the present disclosure, the pixel array chip (PAC) in the micro display device 600 shown in FIG. 6 may be considered as a display integrated circuit driven by a separately provided driver circuit (DRV).

The display integrated circuit may include a silicon substrate, a plurality of subpixels (SP) arranged in a pixel array zone (PAZ) of the silicon substrate and defined by a plurality of gate lines (GL) and a plurality of data lines (DL), and a plurality of through-electrodes arranged in a through-zone at an outer periphery of the pixel array zone (PAZ) and connected to the plurality of gate lines and the plurality of data lines.

The plurality of subpixels may be driven by a data voltage and a scan signal transferred through the plurality of through-electrodes from a separately implemented driver circuit (DRV).

The separately implemented driver circuit (DRV) may be an integrated circuit or a circuit implemented on a printed circuit board.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A micro display device comprising:
a pixel array chip including a pixel array zone in which a plurality of subpixels defined by a plurality of gate lines and a plurality of data lines are arranged, and a through-zone in which a plurality of through-electrodes connected to the plurality of gate lines and the plurality of data lines in an outer area of the pixel array zone are arranged; and
a driver chip including a circuit zone in which a driver circuit configured to drive the plurality of gate lines and the plurality of data lines through the plurality of through-electrodes is disposed,
wherein the pixel array chip is disposed on the driver chip,
wherein the pixel array chip includes a plurality of gate through-zones disposed at a partial area in a left outer side and a right outer side of the pixel array zone, and a plurality of source through-zones disposed at a partial area in an upper outer side and a lower outer side of the pixel array zone,
wherein the circuit zone includes at least one pad unit disposed in a side area of the driver chip, where the plurality of gate through-zones and the plurality of source through-zones are not disposed.

2. The micro display device of claim 1, wherein the plurality of gate through-zones:
a plurality of gate through-electrodes connected to the plurality of gate lines, among the plurality of through-electrodes;
and the plurality of source through-zones include a plurality of data through-electrodes connected to the plurality of data lines, among the plurality of through-electrodes.

3. The micro display device of claim 2, wherein the driver chip further comprises a plurality of connection zones in which a plurality of connection ports configured to connect the plurality of through-electrodes to the driver circuit in an outer area of the circuit zone are arranged.

4. The micro display device of claim 3, wherein the plurality of connection zones comprises:
a plurality of gate connection zones disposed at positions corresponding to the plurality of gate through-zones;

and a plurality of source connection zones disposed at positions corresponding to the plurality of source through-zones.

5. The micro display device of claim 4, wherein the driver circuit comprises:
at least one gate driver circuit disposed adjacent to a plurality of gate connection zones in the circuit zone and configured to drive the plurality of gate lines;
at least one source driver circuit disposed adjacent to a plurality of source connection zones in the circuit zone and configured to drive the plurality of data lines;
and a controller configured to convert image input data into image data having a predetermined format and control the at least one gate driver circuit and the at least one source driver circuit according to the image data.

6. The micro display device of claim 5, wherein the at least one pad unit including a plurality of pads arranged therein and configured to electrically connect the driver circuit to an external device.

7. The micro display device of claim 6, wherein the driver circuit further comprises an interface unit disposed adjacent to the at least one pad unit in the circuit zone and configured to transfer, to the controller, the image input data received through one or more pads of the plurality of pads.

8. The micro display device of claim 6, further comprising a power supply circuit disposed adjacent to the at least one source driver circuit in the circuit zone and configured to generate and output a driving voltage and a ground voltage from at least one power supply voltage received through two or more pads of the plurality of pads.

9. The micro display device of claim 8, wherein the power supply circuit is configured to supply the driving voltage and the ground voltage for driving the plurality of subpixels to the pixel array chip through through-electrodes among the plurality of through-electrodes disposed in the at least one source through-zone.

10. The micro display device of claim 5, wherein the driver circuit further comprises at least one line memory disposed between the controller and the at least one source driver circuit and configured to temporarily store the image data output from the controller and output image data stored at a designated timing to the at least one source driver circuit.

11. The micro display device of claim 3, wherein the plurality of connection ports are implemented by a conductive bump or a solder ball.

12. The micro display device of claim 1, wherein the plurality of subpixels comprises:
a driver transistor including a source and a drain which are disposed on a silicon substrate of the pixel array chip and a gate disposed in an insulating layer disposed on the silicon substrate;
and an organic light emitting diode disposed on the insulating layer.

* * * * *